United States Patent
Davis et al.

(10) Patent No.: US 7,471,590 B2
(45) Date of Patent: *Dec. 30, 2008

(54) WRITE CONTROL CIRCUITRY AND METHOD FOR A MEMORY ARRAY CONFIGURED WITH MULTIPLE MEMORY SUBARRAYS

(75) Inventors: John D. Davis, Wallkill, NY (US); Paul A. Bunce, Poughkeepsie, NY (US); Donald W. Plass, Poughkeepsie, NY (US); Kenneth J Reyer, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 66 days.

This patent is subject to a terminal disclaimer.

(21) Appl. No.: 11/762,833

(22) Filed: Jun. 14, 2007

(65) Prior Publication Data

US 2007/0237020 A1 Oct. 11, 2007

Related U.S. Application Data

(63) Continuation of application No. 11/054,059, filed on Feb. 9, 2005, now Pat. No. 7,283,417.

(51) Int. Cl.
*G11C 8/00* (2006.01)

(52) U.S. Cl. .................. 365/230.06; 365/189.09; 365/226; 365/230.03

(58) Field of Classification Search ............ 365/189.09, 365/230.06, 226, 230.03
See application file for complete search history.

(56) References Cited

U.S. PATENT DOCUMENTS

2005/0207242 A1 9/2005 Yabe

*Primary Examiner*—Huan Hoang
*Assistant Examiner*—Kretelia Graham
(74) *Attorney, Agent, or Firm*—Lynn Augsporger, Esq.; Kevin P. Radigan, Esq.; Helsin Rothenberg Farley & Mesiti P.C.

(57) ABSTRACT

Write control circuitry and control method are provided for a memory array configured with multiple memory subarrays. The write control circuitry includes multiple subarray write controllers associated with the multiple memory subarrays, each subarray write controller selectively enabling a local write control signal to its associated memory subarray. The selectively enabling is responsive to a received subarray select signal, wherein only one subarray select signal is active at a time. At least some subarray write controllers are powered at least in part via a switched power node, wherein powering of the switched power node is distributively implemented among the subarray write controllers. In one example, the distributively implemented powering of the switched power node is accomplished via multiple inverters distributed among the subarray write controllers, each inverter having an output coupled to the switched power node, and an input coupled to receive a global write enable signal.

5 Claims, 6 Drawing Sheets

EXAMPLE OF WRITING HIERARCHICAL BITLINE
WITHOUT LOCAL WRITE CONTROL CIRCUIT

WORDLINE X 

WORDLINES OTHER THAN X 

ALL LOCAL BITLINES 

ALL LOCAL $\overline{\text{BITLINES}}$ 

*fig. 5*

EXAMPLE OF WRITING HIERARCHICAL BITLINE
WITH A LOCAL WRITE CONTROL CIRCUIT

WORDLINE X 

WORDLINES OTHER THAN X 

LBLX 

$\overline{\text{LBLX}}$ 

ALL OTHER LOCAL BITLINES 

$\overline{\text{ALL OTHER LOCAL BITLINES}}$ 

*fig. 6*

WRITE CONTROL CIRCUITRY AND METHOD FOR A MEMORY ARRAY CONFIGURED WITH MULTIPLE MEMORY SUBARRAYS

CROSS-REFERENCE TO RELATED APPLICATION/PATENT

This application is a continuation of co-pending U.S. patent application Ser. No. 11/054,059, filed Feb. 9, 2005, and published Aug. 10, 2006, as U.S. Patent Publication No. US 2006/0176756 A1, entitled "Write Control Circuitry and Method for a Memory Array Configured with Multiple Memory Subarrays", by Davis et al., the entirety of which is hereby incorporated herein by reference. Further, this application contains subject matter which is related to the subject matter of the following application/patent, which is assigned to the same assignee as this application and which is hereby incorporated herein by reference in its entirety:

"Global and Local Read Control Synchronization Method and System for a Memory Array Configured with Multiple Memory Subarrays", by Bunce et al., U.S. Pat. No. 7,088,638, issued Aug. 8, 2006.

TECHNICAL FIELD

This invention relates in general to the operation of memory arrays, and more particularly, to subarray write control circuitry and method for controlling writing to a particular memory subarray of a memory array configured with multiple memory subarrays.

BACKGROUND OF THE INVENTION

Memory arrays with hierarchical or "segmented" bitline architecture have been developed in recent years in order to increase the integration density of memory chips. This architecture allows for a reduced number of space-consuming sense amplifiers for a given number of memory cells, thus reducing chip size or increasing memory capacity for a given sized chip.

In a hierarchical bitline architecture, each column within a memory cell array includes a number of equal length local bitlines (LBLs), directly connected to the memory cells, and to global bitlines (GBLs), for example, composed of a high conductivity metal disposed at a higher fabrication layer than the local bitlines. By way of example, each local bitline may connect to several hundred memory cells, while each global bitline is connected directly to a sense amplifier and is selectively coupled to a number of local bitlines in a common column by a number of switches. To access (e.g., write) a memory cell connected to a particular local bitline, the switch connecting that local bitline to the global bitline is closed, while the other switches in the column are open.

In order to write a standard six-transistor memory cell, two actions are required. The candidate memory cell's wordline must be raised and a differential voltage (typically full rail) must be applied to the cell's bitline. The particular wordline that is raised is determined by the write_address signal. Typically, the memory cells in a word address space share a common bitline pair. In a hierarchical bitline design, however, the bitline pairs are partitioned into "local" segments that correspond to subsets of the word address space. When writing a memory cell in this hierarchical configuration, it is sufficient to simply apply the same differential to each local bitline segment. This method, however, is inefficient from a power dissipation perspective.

Therefore, there exists a need in the art for a technique for generating control signals which can be used to control the writing of individual subarray bitline segments in a memory array configured with multiple memory subarrays, such as a static random access memory (SRAM) array configured with a hierarchical bitline architecture.

SUMMARY OF THE INVENTION

The shortcomings of the prior art are overcome and additional advantages are provided through the provision of write control circuitry for a memory array configured with multiple memory subarrays. The write control circuitry includes multiple subarray write controllers associated with the multiple memory subarrays. Each subarray write controller selectively enables a local write control signal to one associated memory subarray of the multiple memory subarrays. This selectively enabling includes outputting a write enable signal to the associated memory subarray. At least some subarray write controller of the multiple subarray write controllers are powered at least in part via a switched power node, and wherein powering of the switched power node is distributively implemented among the subarray write controllers associated with the multiple memory subarrays.

In another aspect, an apparatus is provided which includes a memory array configured with multiple memory subarrays, and multiple subarray write controllers. Each memory subarray is accessed by a respective subarray select signal. Each subarray write controller, which is associated with one memory subarray of the multiple memory subarrays, selectively enables a write control signal to its associated memory subarray responsive to a received subarray select signal. At least some subarray write controllers of the multiple subarray write controllers are powered at least in part via a switched power node, wherein powering of the switched power node is distributively implemented among the multiple subarray write controllers associated with the multiple memory subarrays.

In a further aspect, a write control method is presented for a memory array configured with multiple memory subarrays. This method includes selectively enabling a write control signal to one memory subarray of the multiple memory subarrays at a time. Each memory subarray having an associated subarray write controller, and wherein the selectively enabling includes allowing one subarray write controller at a time to output a write enable signal to output a write enable signal to its associated memory subarray. At least some subarray write controllers of the associated subarray write controllers are powered at least in part via a switched power node, and wherein powering of the switched power node is distributively implemented among the subarray write controllers associated with the memory subarrays.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 is a timing diagram showing writing of the hierarchical bitlines of FIG. 4 without employing local write control circuitry, in accordance with an aspect of the present invention;

FIG. 6 is a timing diagram showing writing of the hierarchical bitline of the architecture of FIG. 4 employing the local bitline write control circuits, in accordance with an aspect of the present invention;

BEST MODE FOR CARRYING OUT THE INVENTION

Figure 1A:
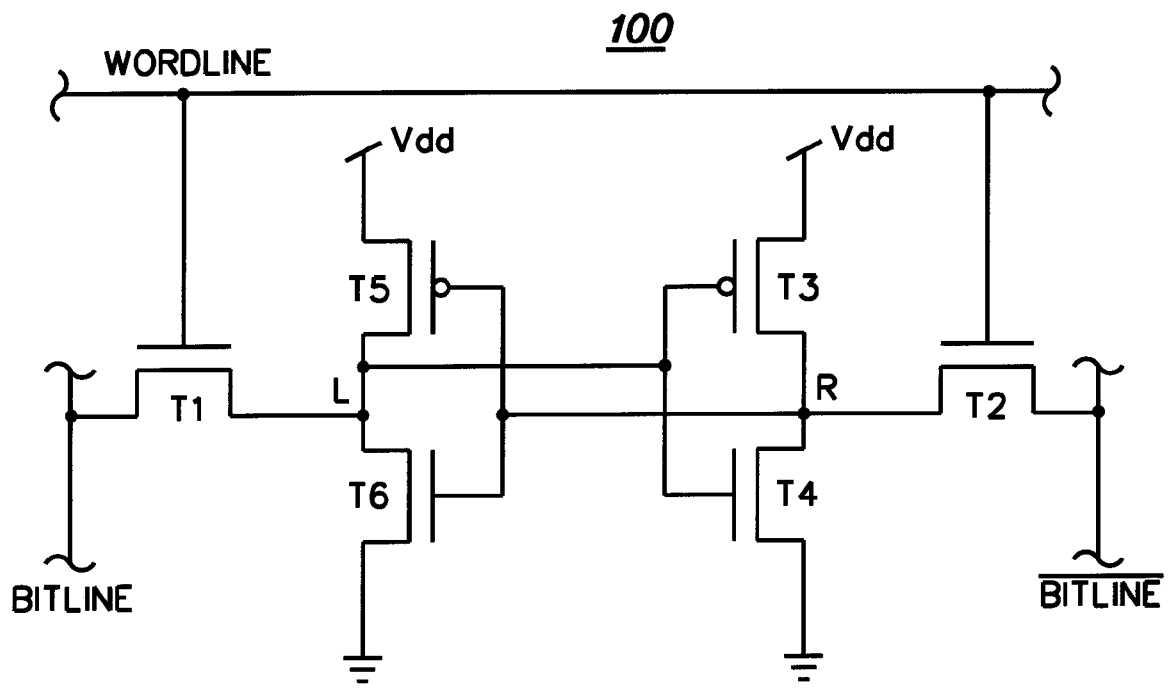
FIG. 1A is a schematic of one embodiment of a standard six-transistor memory cell.

FIG. 1 is a schematic of one embodiment of a standard six-transistor memory cell, generally denoted 100. In order to write memory cell 100, the WORDLINE is raised, and a differential voltage (typically full rail) is applied between the cells' bitlines. The particular wordline to the memory array that is raised is determined by the address to be written. Typically, all the memory cells in the word address space share a common bitline pair (i.e., BITLINE, $\overline{\text{BITLINE}}$).

Figure 1B:
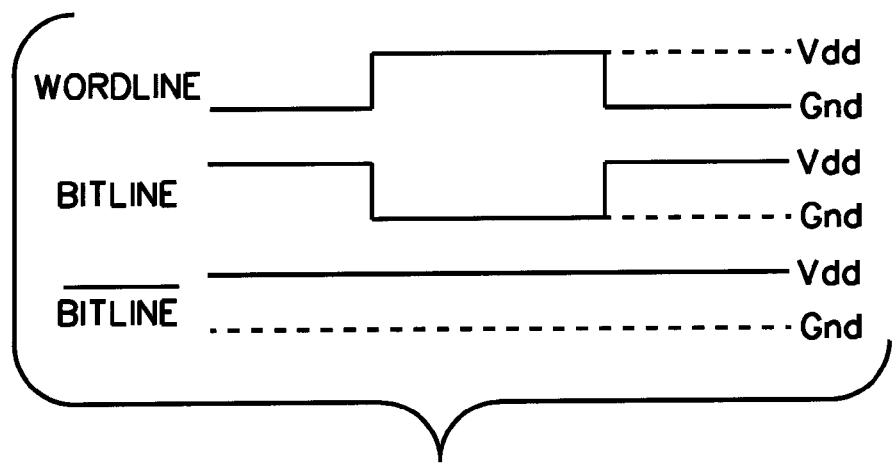
FIG. 1B is a timing diagram showing operation of the memory cell of FIG. 1A.

Operationally, assuming WORDLINE is brought high as shown in FIG. 1B, transistors T1 & T2 are both gated active. Assume further that BITLINE is pulled down, while $\overline{\text{BITLINE}}$ is held high. The timing diagram of FIG. 1B illustrates the WORDLINE being brought high for a period of time commensurate with the BITLINE being pulled low in order to write a zero to the memory cell. During this time interval, $\overline{\text{BITLINE}}$ remains high as shown.

With the above assumptions, the left side of the memory cell is pulled low. This is because transistor T1 is active, and the low signal on BITLINE is applied to node L, which comprises the commonly coupled drains of PFET T5 & NFET T6 connected between supply voltage Vdd and ground. As shown, node L gates PFET T3 and NFET T4, which are also serially coupled between supply voltage Vdd and ground. When node L is brought low, node R remains high, which gates transistor T6 on reinforcing the bit 0 that is being written to the memory cell via the low BITLINE input. Conversely, if a "1" is to be written to the memory cell, BITLINE remains high, while $\overline{\text{BITLINE}}$ is pulled low. Thus, depending upon which bitline is pulled low, the associated inverter drives the opposite inverter to reinforce the signal to be applied to the memory cell.

Figure 2:
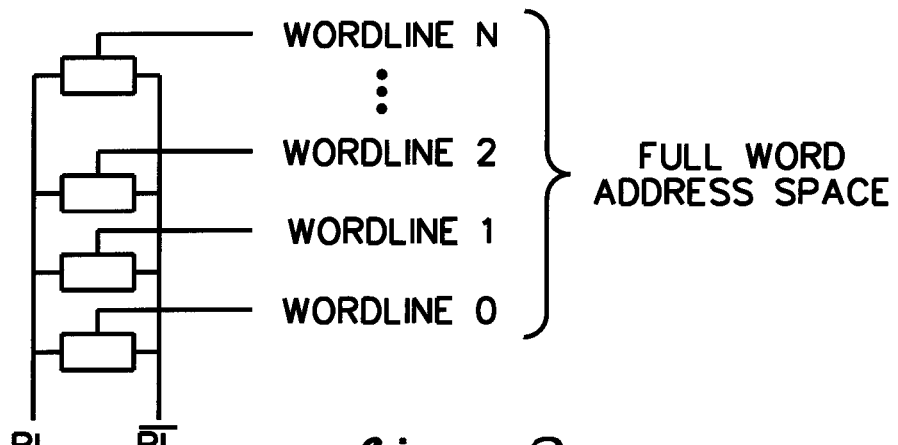
FIG. 2 is a depiction of one embodiment of a flat bitline memory array design showing a stacked column of memory cells.

FIG. 2 illustrates one example of a conventional flat bitline design, showing a column of stacked memory cells wherein each wordline represents a word in memory. Again, only one wordline is brought high at a time, and only one of bitline (BL) or $\overline{\text{BITLINE}}$ ($\overline{\text{BL}}$) is brought low at a time.

Figure 3:
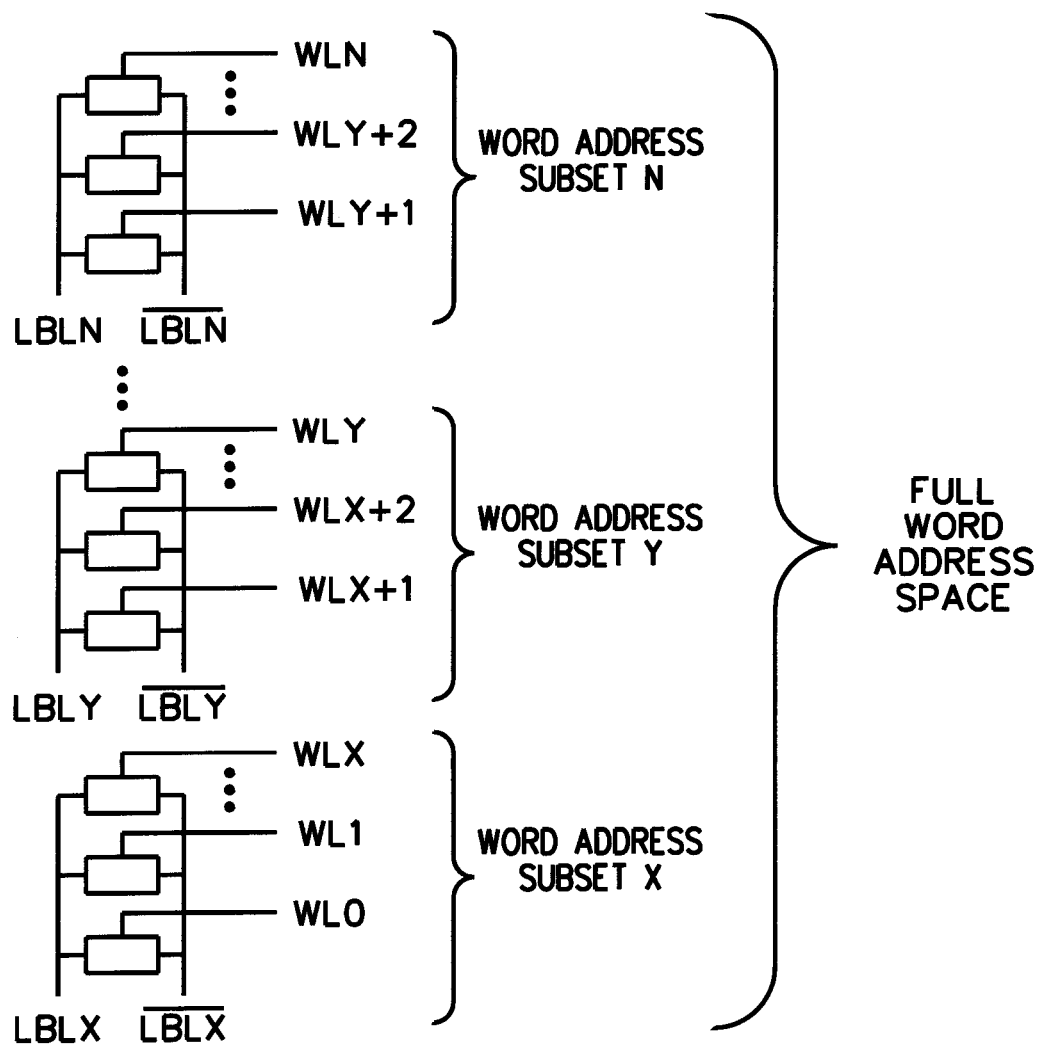
FIG. 3 is a depiction of a hierarchical bitline design for a memory array, showing partitioned bitline pairs for accessing groups of memory cells, in accordance with an aspect of the present invention.

FIG. 3 is a high level representation of a memory array configured with a hierarchical bitline design. In this figure, a full word address space is partitioned into word address subsets X, Y . . . N, and the bitlines are partitioned into local bitlines (LBLX, LBLY . . . LBLN and $\overline{\text{LBLX}}$, $\overline{\text{LBLY}}$ . . . $\overline{\text{LBLN}}$). In this embodiment, each local bitline pair services only a subset of the full address space, while wordlines remain global as in the design of FIG. 2.

Figure 4:
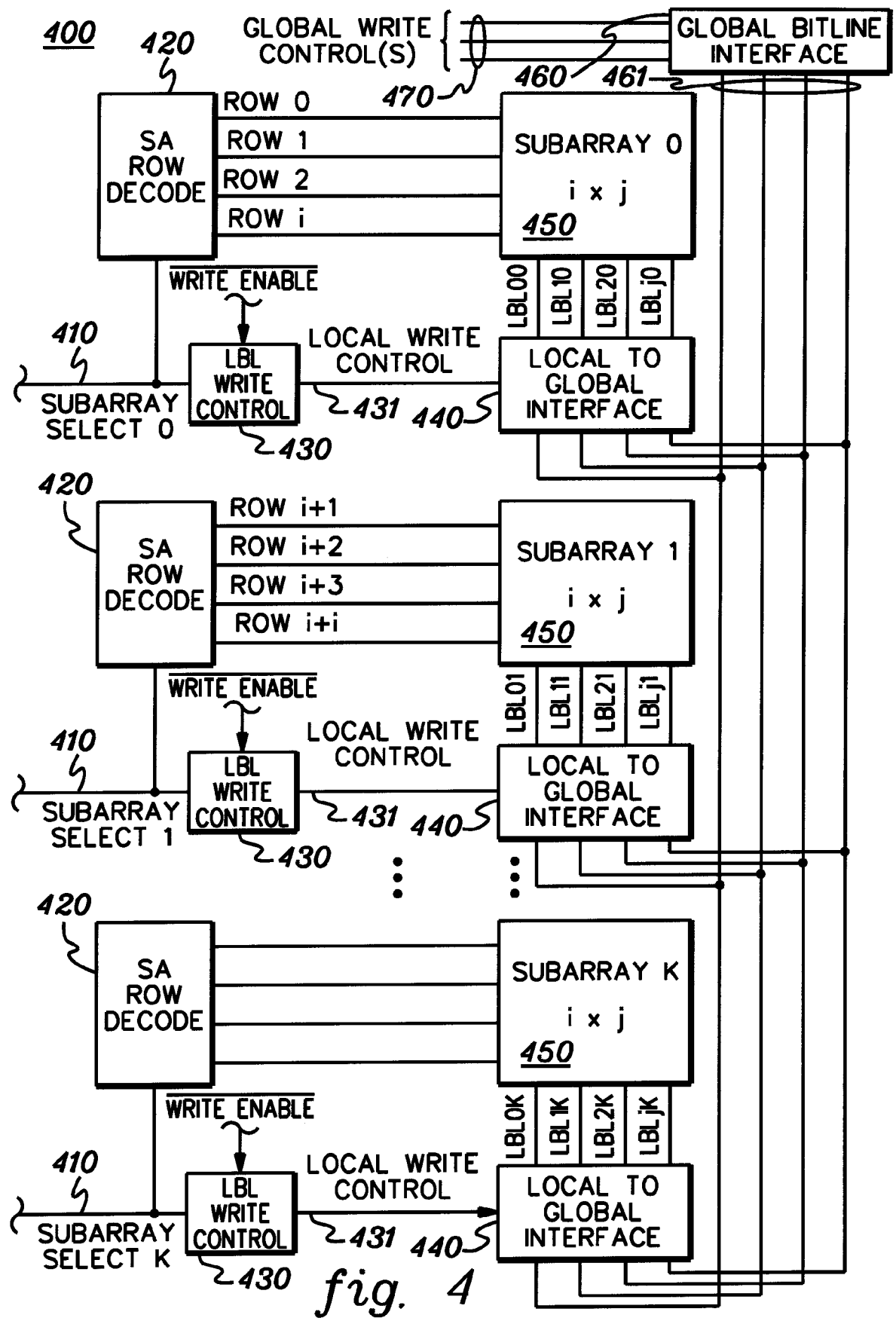
FIG. 4 depicts a further embodiment of a memory array configured with a hierarchical bitline architecture, in accordance with an aspect of the present invention.

A memory array with a hierarchical bitline architecture is depicted in greater detail in FIG. 4. This memory array, generally denoted 400, is configured with multiple memory subarrays 450. In order to write data to the memory array, address signals are decoded by an address decoder (not shown) to activate a given row of cells within a selected subarray. The subarrays are selected via subarray select signals 410, which are output from the address decoder. Generation of the subarray select signals can be similar to that described in the above-incorporated, co-filed application entitled "Global and Local Read Control Synchronization Method and System for a Memory Array Configured with Multiple Memory Subarrays."

Each subarray select signal 410 activates the wordlines of only the associated subarray. This activation occurs by passing each subarray select signal through the respective subarray (SA) row decoder 420 and associated local bitline (LBL) write control circuitry 430. The SA row decoder 420 selected by a subarray select signal 410 then selects (via other address bit signals (not shown) received from the address decoder) a single row or wordline within the subarray into which to write data. The local subarray write function is controlled by a local write control (or local write enable) signal 431 output from the LBL write control circuitry 430. The LBL write control circuitry also receives, in one embodiment, a global write enable signal (e.g., $\overline{\text{WRITEENABLE}}$). The local write control 431 is input into a local-to-global interface 440 which writes a bit of data to a selected memory cell via a selected local bitline, for example, LBL00 of subarray 0. The data to be written via this bitline is received from a corresponding global bitline 461. Global bitlines 461 provide signals to all the subarrays of the hierarchical architecture. As one example, 256 rows of data can be organized in 16 subarrays of 16 wordlines each. In this case, each local bitline can access 16 bits of data. The 16 subarrays are then combined on the global bitline. Global bitlines 461 are tied to a global bitline interface 460, which receives as inputs global write control signals 470.

When writing a memory cell in an array having a hierarchical configuration such as depicted in FIGS. 3 & 4, it is sufficient to simply apply the same differential to each local bitline segment. FIG. 5 is a timing diagram depicting the writing of a memory array with a hierarchical bitline architecture and without using local bitline write control circuitry. In this diagram, a WORDLINE X is brought high, while the remaining wordlines remain at ground. All local BITLINES are pulled low commensurate with WORDLINE X going high, while all local $\overline{\text{BITLINES}}$ remain high. Although functional, this method is inefficient from a power consumption perspective.

Therefore, in accordance with the present invention, local write control signals are generated for each local bitline subarray. The generation of these signals is accomplished employing a technique that is fast, area efficient, and does not severely impact the input capacitance on the write control input signals.

More particularly, provided herein are techniques for generating local write control signals for use in a hierarchical bitline memory array design. Each local bitline (LBL) write control circuit receives a subarray select signal indicating when a wordline in that bitline segment is to be active. Additionally, each LBL write controller receives a write enable signal (e.g., $\overline{\text{WRITEENABLE}}$) indicating when the memory array is to perform a write operation. In one embodiment, the LBL write control circuitry comprises a buffer, with an internal switched power node powering the first stage of the buffer. Distributed N-channel field-effect transistors (NFETs) and P-channel field-effect transistors (PFETs) are employed in powering the switched node, thereby enabling a high density layout, i.e., the switched power node devices can be implemented in space that would otherwise be whitespace within the associated memory subarray. In one aspect, certain embodiments presented herein share a distributed NFET and PFET across selected and unselected memory subarrays. The distributed nature and sharing of the circuitry presented reduces loading on the write control signal and the subarray select signal, and reduces the overall layout area of the design.

FIG. 6 depicts a timing diagram for a memory array with a hierarchical bitline architecture which employs local bitline control circuits such as depicted in FIG. 4. In this example, a global WORDLINE X is again brought high, while wordlines other than WORDLINE X remain low. A local bitline LBLX is brought low commensurate with WORDLINE X going high, while the complementary bitline $\overline{\text{LBLX}}$ remains high. All other local bitline pairs remain high at voltage Vdd; that is, only the local bitline of the subarray containing the cell to be written is pulled low.

Figure 7:
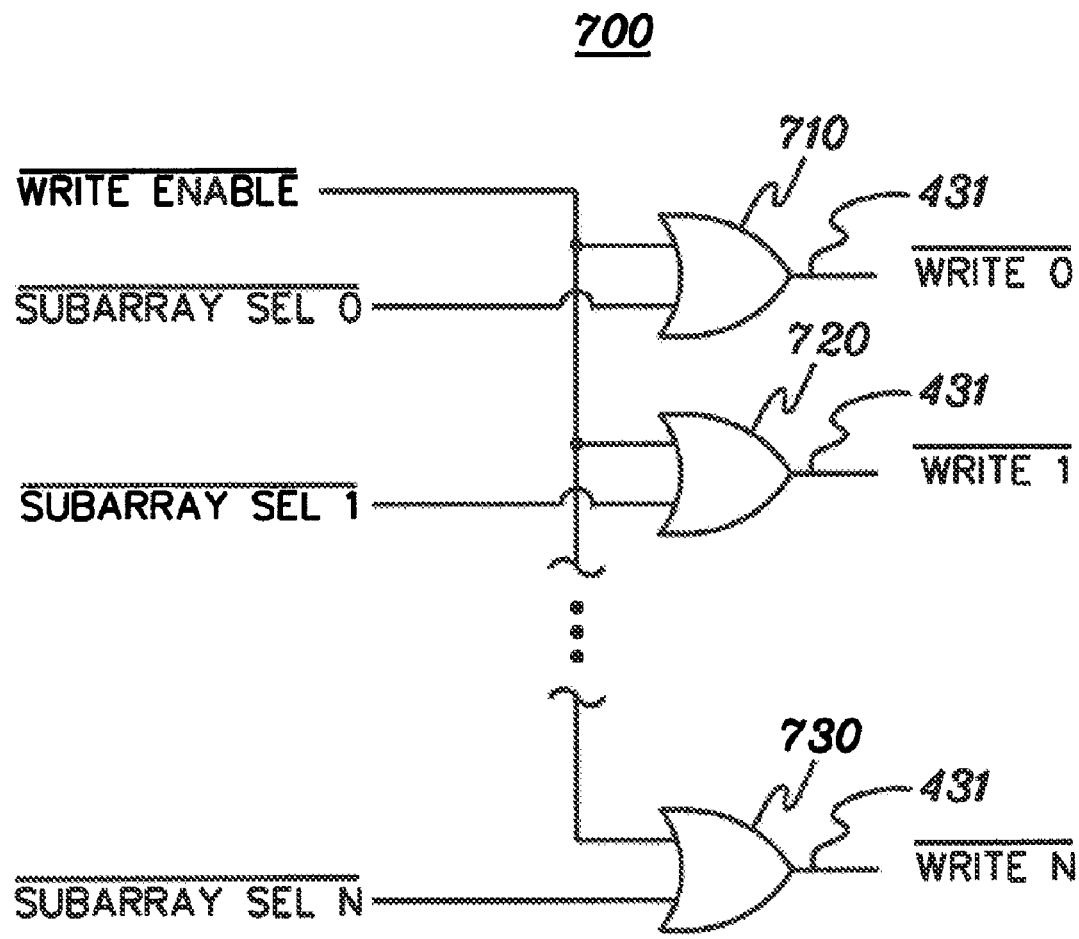
FIG. 7 depicts one implementation of the local bitline write controllers of FIG. 4, in accordance with an aspect of the present invention.

One implementation of the LBL write control circuits of FIG. 4 is depicted in FIG. 7. As described above in connection with FIG. 4, two classes of signals are received at each LBL write control circuit. The first signal class is a subarray select signal, labeled $\overline{\text{SUBARRAYSEL0}}$, $\overline{\text{SUBARRAYSEL1}}$ . . . $\overline{\text{SUBARRAYSELN}}$ in FIG. 7. These subarray select signals are constrained so that only one $\overline{\text{SUBARRAYSELECT}}$ signal can be low at a time. A low on a given subarray select line of FIG. 7 indicates an active signal. The second class of signals is a single global write enable (i.e., $\overline{\text{WRITEENABLE}}$). A low on this signal also indicates an active state (i.e., a write state). FIG. 7 is a distributed representation of the local bitline write control circuits 430 of FIG. 4. In this implementation, a plurality of OR circuits 710, 720 & 730 each receive the $\overline{\text{WRITEENABLE}}$ signal, and an associated $\overline{\text{SUBARRAYSEL}}$ signal. The output of each OR circuit 710, 720, 730 is a respective write enable signal ($\overline{\text{WRITE0}}$, $\overline{\text{WRITE1}}$ . . . $\overline{\text{WRITEN}}$) output as the respective local write control 431.

In one implementation, the OR circuits 710, 720 & 730 can be implemented employing two series connected PFETs. Because these PFETs are series connected, they are relatively large in order to maintain a sufficient drive strength, which makes the circuit implementation larger and adds capacitance to the input of the LBL write control circuits.

Figure 8A:
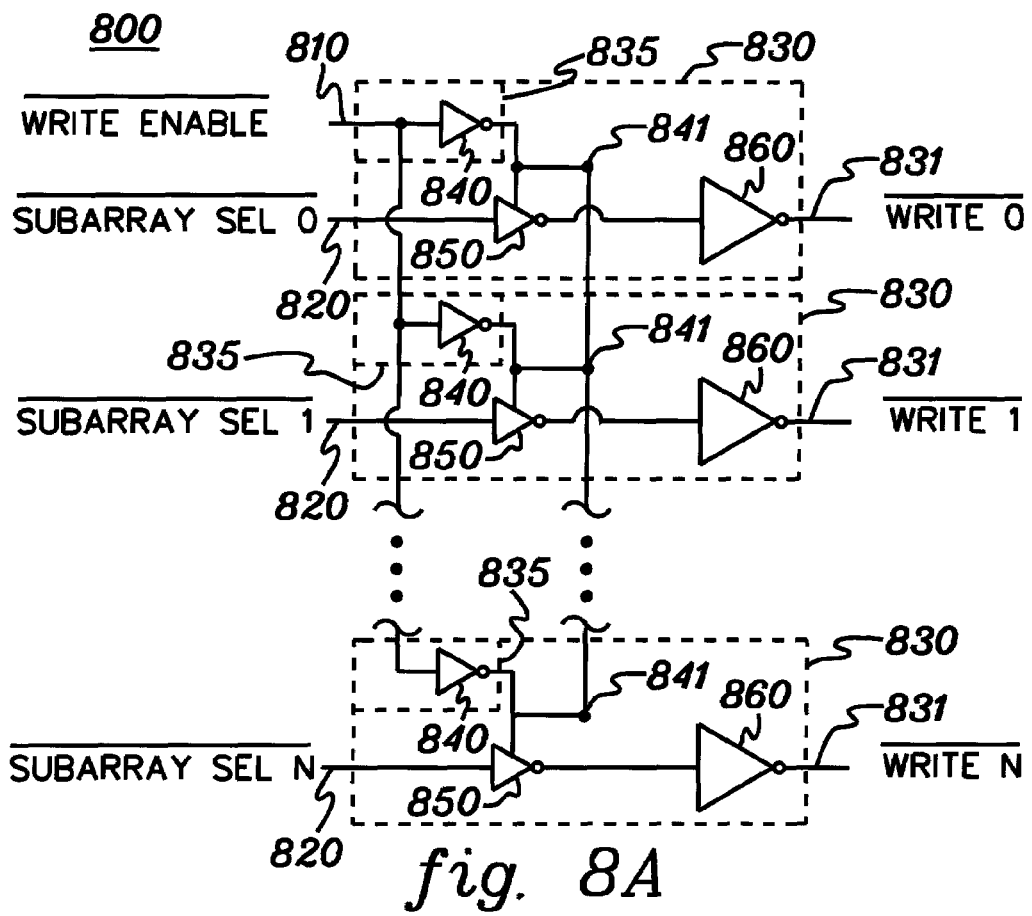
FIG. 8A depicts an alternate implementation of the local bitline write controllers of FIG. 4, in accordance with an aspect of the present invention.
Figure 8B:
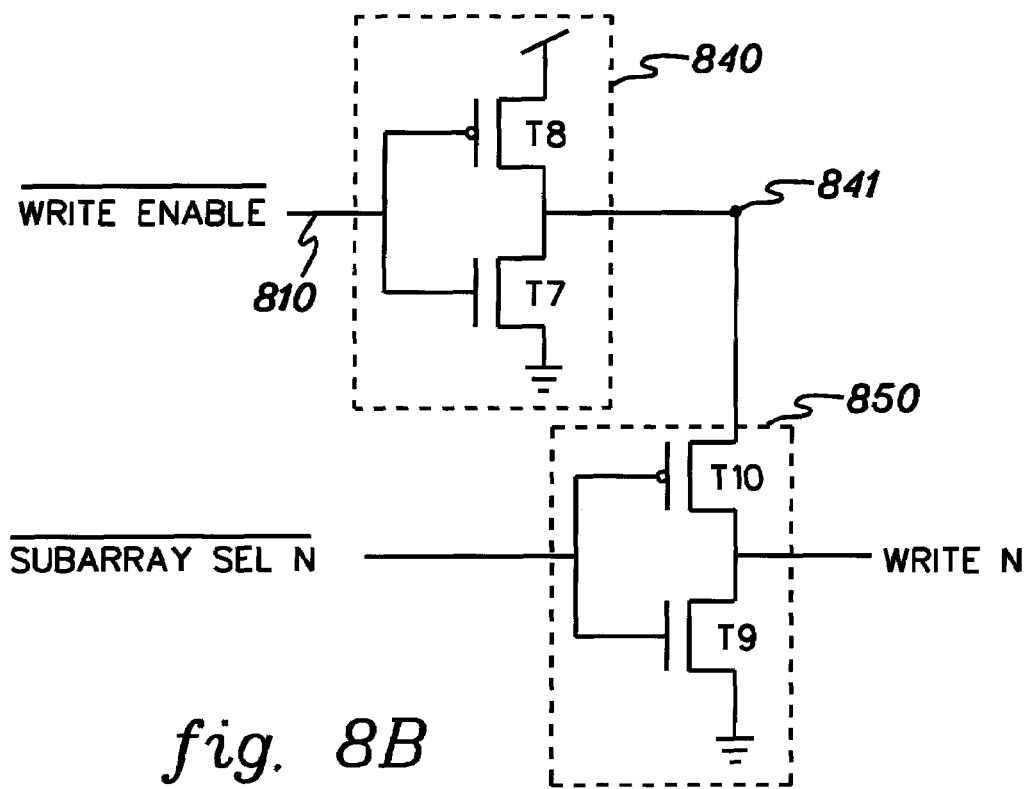
FIG. 8B is a schematic of one implementation of a powering inverter and an input inverter for a local bitline write controller of FIG. 8A, in accordance with an aspect of the present invention.

An alternative implementation for the local bitline write control circuitry of FIG. 4 is depicted in FIGS. 8A & 8B. In this implementation, multiple LBL write controllers 830 are shown, each receiving as one input the global write enable signal $\overline{\text{WRITEENABLE}}$ signal, and as a second input, a respective subarray select signal $\overline{\text{SUBARRAYSEL0}}$, $\overline{\text{SUBARRAYSEL1}}$ . . . $\overline{\text{SUBARRAYSELN}}$. As noted above, only one subarray select signal is active at a time. The global write enable signal 810 is input to a plurality of inverters 840 which are distributed in multiple separate available spaces 835 (i.e., white spaces) across the memory cell, for example, as part of the various LBL write controllers 830. These distributed inverters 840 function as drivers which power (i.e., drive) a switched power node 841. Switched power node 841 controls activation of an initial inverter stage 850 within each LBL write controller 830. In order for the initial 850 to output an active signal, the inputted subarray select signal must be active and the switched power node must be powered. Each LBL write controller further includes a larger inverter 860 coupled in series with the smaller inverter 850. The output of this larger inverter comprises the respective write enable signals 831 (e.g., $\overline{\text{WRITE0}}$, $\overline{\text{WRITE1}}$ . . . $\overline{\text{WRITEN}}$).

FIG. 8B depicts one transistor implementation of the coupled inverters 840 & 850 of one LBL write controller 830 of FIG. 8A. In this implementation, the distributed power inverters 840 each comprise an NFET T7 and PFET T8 coupled as shown between ground and supply voltage Vdd. The transistors are commonly gated by the global write enable signal ($\overline{\text{WRITEENABLE}}$), and their commonly coupled drains connect to the switched power node 841, which controls activation of the small input inverter 850 of the respective LBL write controller 830 (see FIG. 8A).

In the embodiment shown, the small input buffer 850 comprises an NFET T9 and a PFET T10 coupled between the switched power node 841 and ground. This inverter is gated by the corresponding subarray select signal (e.g., $\overline{\text{SUBARRAYSELN}}$) and outputs a write enable signal (e.g., WRITE N) via the commonly coupled drains. This intermediate subarray write enable signal is then passed through the larger inverter 860 (see FIG. 8A) of the respective LBL write controller to generate the desired write enable 831 (e.g., $\overline{\text{WRITEN}}$).

Those skilled in the art will note that the LBL write control circuitry of FIGS. 8A & 8B has a first stage buffer 850 that would normally be tied to supply voltage Vdd, instead coupled to the switched power supply node 841. This power supply node 841 is high only when the corresponding global write enable signal is active. Without this supply being high, all outputs from the LBL write controllers are inactive. Only when the global write enable is active (e.g., $\overline{\text{WRITEENABLE}}$ is low), will the switched power node supply 841 be active and the corresponding subarray select signal be capable of being processed.

The use of a switched supply coupled with a constraint that no more than one subarray select input is to be active at a time, permits the use of relatively small (i.e., compared to the case of multiple inputs being low) PFETs. For example, each PFET may only need to be $(1/N)^{th}$ the size of the PFETs used in the NOR gate of FIG. 7, where N is equal to the number of subarray selects. This is because the power node only has to power up one buffer input stage. Since this PFET can be relatively small, it can be physically distributed in the layout where it is more likely to fill "whitespace" rather than be a lumped device that would need its own dedicated area. This is also true of the NFET used to hold the supply low when the write enable signal is inactive. An added benefit of the switched power supply design is that the total input capacitance is relatively small for both the write enable signal and the subarray select signals.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A write control method for a memory array configured with multiple memory subarrays, the method comprising:

multiple subarray write controllers associated with the multiple memory subarrays, each subarray write controller selectively enabling a local write control signal to one associated memory subarray of the multiple memory subarrays, wherein the selectively enabling comprises outputting a write enable signal to the associated memory subarray, and wherein the multiple subarray write controllers are powered via a common switched power node and are connected between the common switched power node and ground, and wherein the common switched power node is driven by multiple drivers distributively implemented among the multiple subarray write controllers associated with the multiple memory subarrays; and gating each subarray write controller with a different subarray select signal of a plurality of subarray select signals, wherein only one select signal is active at a time, resulting in only one write enable signal being output from one subarray write controller to its associated memory subarray at a time.

2. The method of claim 1, wherein the multiple drivers are distributively implemented within the multiple subarray write controllers associated with the multiple memory subarrays.

3. The method of claim 1, wherein the distributively implemented drivers driving the switched power node comprise multiple inverters distributed among the subarray write controllers, each inverter having an output coupled to the switched power node, and an input coupled to receive a global write enable signal, wherein the multiple inverters power the switched power node responsive to the global write enable signal.

4. The method of claim 3, wherein each inverter is a PFET and NFET pair coupled between a supply voltage Vdd and ground, with commonly connected gates receiving the global write enable signal, and commonly coupled drains connected to the switched power node.

5. The method of claim 4, wherein the multiple inverters are implemented in multiple separate available spaces of the subarray write controllers.

* * * * *